(12) United States Patent
Ikeda et al.

(10) Patent No.: US 8,796,563 B2
(45) Date of Patent: Aug. 5, 2014

(54) CONNECTION STRUCTURE, POWER MODULE AND METHOD OF MANUFACTURING THE SAME

(75) Inventors: Ukyo Ikeda, Fujisawa (JP); Masato Nakamura, Fujisawa (JP); Shiro Yamashita, Yokohama (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 442 days.

(21) Appl. No.: 12/696,762

(22) Filed: Jan. 29, 2010

(65) Prior Publication Data

US 2010/0206632 A1    Aug. 19, 2010

(30) Foreign Application Priority Data

Feb. 13, 2009 (JP) .................................. 2009-030979
May 15, 2009 (JP) .................................. 2009-118448

(51) Int. Cl.
| | |
|---|---|
| *H01L 23/49* | (2006.01) |
| *H05K 1/03* | (2006.01) |
| *H05K 1/16* | (2006.01) |
| *H05K 1/11* | (2006.01) |
| *H01L 23/48* | (2006.01) |
| *H01L 29/40* | (2006.01) |
| *H05K 7/10* | (2006.01) |

(52) U.S. Cl.
USPC ........... 174/538; 174/255; 174/260; 174/261; 257/E21.518; 257/784; 257/739; 361/768; 361/771; 361/772

(58) Field of Classification Search
USPC .......... 257/784, E21.518, 739; 174/255, 260, 174/261, 262, 538; 361/760, 767, 768, 771, 361/772; 428/209, 627
See application file for complete search history.

(56) References Cited

U.S. PATENT DOCUMENTS

| | | | |
|---|---|---|---|
| 5,175,609 A | | 12/1992 | DiGiacomo et al. |
| 5,493,075 A | * | 2/1996 | Chong et al. ................. 174/261 |
| 5,795,818 A | * | 8/1998 | Marrs ........................... 438/612 |
| 6,538,335 B2 | * | 3/2003 | Shimada et al. .............. 257/780 |
| 6,541,352 B2 | * | 4/2003 | Wachtler ...................... 438/460 |

(Continued)

FOREIGN PATENT DOCUMENTS

| | | |
|---|---|---|
| EP | 0 727 818 A1 | 8/1996 |
| EP | 1 729 343 A2 | 12/2006 |

(Continued)

OTHER PUBLICATIONS

MatWeb. Online Material Data Sheet. Gold. http://www.matweb.com/search/DataSheet.aspx?MatGUID=d2a2119a08904a0fa706e9408cddb88e&ckck=1. Accessed Feb. 23, 2012.*

(Continued)

*Primary Examiner* — Hoa C Nguyen
*Assistant Examiner* — Binh Tran
(74) *Attorney, Agent, or Firm* — Crowell & Moring LLP

(57) ABSTRACT

In ultrasonic bonding of a metal terminal to a substrate pad, a thin buffer metal layer which is formed of a soft metal or a highly slidable metal is interposed between a terminal edge and a pad so as to prevent direct contact between an end of the terminal and the pad upon bonding. This makes it possible to prevent abrasion and a crack in the pad at the end of the terminal caused by pressure and an ultrasonic wave upon the ultrasonic bonding. This makes it possible to realize a compact bonded structure with high reliability.

5 Claims, 14 Drawing Sheets

(56) References Cited

U.S. PATENT DOCUMENTS

| | | | |
|---|---|---|---|
| 2002/0195476 A1* | 12/2002 | Baba et al. | 228/2.1 |
| 2004/0217488 A1 | 11/2004 | Luechinger | |
| 2008/0093729 A1 | 4/2008 | Siepe et al. | |
| 2009/0201699 A1* | 8/2009 | Ohno | 362/634 |

FOREIGN PATENT DOCUMENTS

| | | | |
|---|---|---|---|
| JP | 64-50595 A | 2/1989 |
| JP | 10-50768 A | 2/1998 |
| JP | 2998942 B2 | 11/1999 |
| JP | 2002-280416 A | 9/2002 |
| JP | 2003-45920 A | 2/2003 |
| JP | 2005-259880 A | 9/2005 |
| JP | 2007-88030 A | 4/2007 |
| JP | 2007-173363 A | 7/2007 |
| JP | 2007-251009 A | 9/2007 |
| JP | 2008-177307 A | 7/2008 |

OTHER PUBLICATIONS

MatWeb. Online Material Data Sheet. Copper. http://www.matweb.com/search/DataSheet.aspx?MatGUID=9aebe83845c04c1db5126fada6f76f7e. Accessed Feb. 23, 2012.*

MatWeb. Online Material Data Sheet. Nickel. http://www.matweb.com/search/DataSheet.aspx?MatGUID=6ff5489dc63b45e0af7ceb548df9f23f. Accessed Feb. 23, 2012.*

European Search Report dated Aug. 17, 2011 (seven (7) pages).

* cited by examiner

CONNECTION STRUCTURE, POWER MODULE AND METHOD OF MANUFACTURING THE SAME

CLAIM OF PRIORITY

The present application claims priority from Japanese Patent Application JP 2009-030979 filed on Feb. 13, 2009 and JP 2009-118448 filed on May 15, 2009, the content of which is hereby incorporated by reference into this application.

BACKGROUND

1. Field of the Invention

The present invention relates to a technology for bonding a metal terminal to a substrate pad.

2. Description of the Related Art

An automobile has control units mounted thereon for electronically controlling a power train system such as an engine, and a steering system for steering operation. The control unit is demanded to exhibit functionally high reliability. Recently, the automobile has been developed into a highly sophisticated and multifunctional structure, resulting in increased control units installed in the automobile. Meanwhile, the automobile has the limited space for accommodating the aforementioned control units, and accordingly, downsizing (compact structure) of the control unit is highly demanded.

A module for converting and controlling electric power (power module) is installed in the control unit. FIG. 2 illustrates a structure of a generally employed power module substrate. A high-heat generating power device 230 such as a MOSFET (Metal-Oxide-Semiconductor Field-Effect Transistor) is mounted on a substrate 210. The power module receives high current application in the range from several tens to hundreds amperes or higher. Because of high heat value, it is important to produce the power module in consideration of conductivity and radiation performance.

The power module is connected to another module through Al wire bonding or Cu terminal solder connection. The aforementioned process, however, has a disadvantage as follows. That is, the upper limit of the wire radius for the Al wire bonding is set to several hundreds μm. Meanwhile, the power module receives application of the electric current in the range from several tens to hundreds amperes or higher.

From the aspect of electric resistance, plural wires have to be connected to a single bonded portion, and accordingly, the resultant structure is no longer compact. Meanwhile, the Cu terminal solder connection allows both values of the width and thickness of the terminal to be increased by the amount in the range from sub mm to several mm to exhibit the high electric conductivity and good radiation performance.

FIGS. 3A and 3B are perspective views illustrating how the module substrates are laminated. FIG. 3A is a perspective view illustrating connection of a terminal for bonding the module substrate to the other. FIG. 3B is a perspective view illustrating a state where the module substrates are bonded using the terminal. FIG. 3B omits elements of the other module substrate except the connection solder portion.

FIGS. 3A and 3B illustrate that Cu terminals 220 are mounted on a substrate 210 with solders 240, and then each one end of the Cu terminals 220 is connected to another module 250 with a solder 260. In this case, the solder connection for bonding the modules is performed by using through hole.

In the aforementioned case, when the same material for forming the solder 240 which is used for connecting the Cu terminal with the substrate is used for forming the solder 260 which is used for connecting the Cu terminal 220 to the other module 250, the problem of remelting the solder 240 for connecting the Cu terminal and the substrate will occur.

For solving the aforementioned problem, the material with higher fusing point than that of the material for forming the solder 260 for connecting the modules is used for forming the solder 240 for connecting the Cu terminal with the substrate. In this case, however, the mount structure, material, and the connection process will be restricted. Recently, ultrasonic bonding of the Cu terminal has been drawing attention as the solution.

Japanese Published Unexamined Patent Application Nos. 2007-173363, 2007-088030, and 2002-280416 disclose the connection technology through ultrasonic bonding in place of the soldering.

FIGS. 4A and 4B schematically illustrate generally employed ultrasonic bonding. FIG. 4A is a sectional view, and FIG. 4B is a plan view corresponding to FIG. 4A with an ultrasonic tool removed. A Cu terminal 320 is disposed on a substrate pad 313. The ultrasonic oscillation is applied to the Cu terminal in a direction parallel with the substrate surface while being pressed from above.

Renewed surfaces of the interface between the terminal and the pad formed by removing adhered matter and oxide are bonded. In the aforementioned ultrasonic bonding, the solder which has been applied before is not remelted. The Cu terminal may be directly bonded to the substrate pad 313, thus providing the compact bonded structure with high electric conductivity and high radiation performance.

In the ultrasonic bonding of the terminal to the substrate pad as described above, abrasion 114 or a crack 115 may occur in the pad just below the terminal edge during the bonding as illustrated in FIG. 5, resulting in deteriorated reliability. The terminal edge is designated with a bold dashed line 321 shown in FIG. 4B. As high frictional force is exerted to the pad 113 below the edge of a terminal 120, a shear force is caused under the friction. The abrasion 114 and the crack 115 occur on the line of the dotted line 321, which is perpendicular to the moving direction of the ultrasonic wave as shown in FIG. 4B.

The shear force is proportional to the frictional force, and the frictional force is proportional to the pressure, which may cause the abrasion and crack just below the terminal edge where the pressure is locally increased. The crack may be avoided by lowering ultrasonic pressurization. However, this will reduce the bonded area, and accordingly further reduce the bonding strength, conductivity and radiation performance.

The region which does not cover the terminal edge may be ultrasonic bonded as shown in FIGS. 7A and 7B. FIG. 7A is a sectional view, and FIG. 7B is a plan view corresponding to FIG. 7A with the ultrasonic bonding tool removed. In the structure as shown in FIGS. 7A and 7B, the pressure applied to the portion of the pad 113 just below the edge of the terminal 120 is reduced for avoiding the abrasion and crack in the pad.

The region which does not cover the terminal edge is ultrasonic bonded by positioning the terminal edge outside a region 131 to be pressurized by an ultrasonic bonding tool 130. The structure shown in FIGS. 7A and 7B may be formed by enlarging the terminal (increasing thickness and length), or reducing the bonded area.

Enlargement of the terminal 120 may prevent pitch reduction, which fails to make the module compact. Meanwhile, the area reduction may deteriorate the conductivity and radiation performance. The generally employed technique for the ultrasonic bonding of the terminal to the substrate pad has difficulties in satisfying those requirements at a time, that is, high reliability, bonding strength, conductivity, and radiation performance without causing a crack for achieving the compact structure resulting from the pitch reduction.

SUMMARY OF THE INVENTION

The present invention provides a highly reliable compact terminal-substrate bonded structure with excellent bonding strength and conductivity while suppressing deterioration in the radiation performance. The present invention further provides a highly reliable power module which has the aforementioned terminal structure.

The present invention aims to solve the abovementioned problems, and its two aspects are as follows.

A first aspect of the present invention provides a connection structure having a first metal layer, a first insulating layer, a second metal layer, and a third metal layer sequentially laminated in this order. A buffer metal layer formed of a metal which is softer than a metal for forming the second metal layer is interposed between an end of the third metal layer and the second metal layer. The buffer metal layer is provided to partially coat the second metal layer.

A second aspect of the present invention provides a method of manufacturing a connection structure having a first metal layer, a first insulating layer, a second metal layer, and a third metal layer sequentially laminated in this order, the method including the steps of interposing a buffer layer formed of a metal which is softer than the second metal layer between the second metal layer and an end of the third metal layer, and ultrasonic bonding the second metal layer and the third metal layer.

If the soft metal is used for the aforementioned structure, the soft metal is deformed and cut in the initial stage of bonding so as to reduce the frictional force exerted to the pad for preventing abrasion and a crack therein. If the metal with high slidability is used, the antifriction action may reduce the frictional force to provide the same effect as described above.

Meanwhile, the terminal is directly ultrasonic bonded to the pad in the region which does not cover a buffer metal layer 140, thus providing the highly reliable terminal-substrate bonded structure with sufficient bonding strength without a crack in the pad. The respective bonded portions among the pad 113, the buffer metal layer 140 and the terminal 120 of the structure may contribute to improvement in the conductivity and the radiation performance. This makes it possible to suppress deterioration in the conductivity and the radiation performance to a certain extent due to reduction in the area where the pad is directly bonded to the terminal.

Referring to FIG. 11, if the buffer metal layer 140 exists over a protrusion 121 of the terminal, the buffer metal is pressed outward from the tip of the protrusion 121 upon the ultrasonic bonding, which allows the pad 113 to be bonded to the terminal around the protrusion. In this case, the buffer metal layer exists over the end of the terminal, which may provide the highly reliable terminal-substrate bonded structure with sufficient bonding strength without causing a crack in the pad. The same effect may be obtained by forming the bonded surface of the terminal into the convex curve instead of forming the protrusion on the terminal.

The use of the aforementioned bonded structure provides the compact power module with high reliability. Installation of the power module provides a high quality on-board electronic device.

DESCRIPTION OF THE PREFERRED EMBODIMENTS

Figure 1:
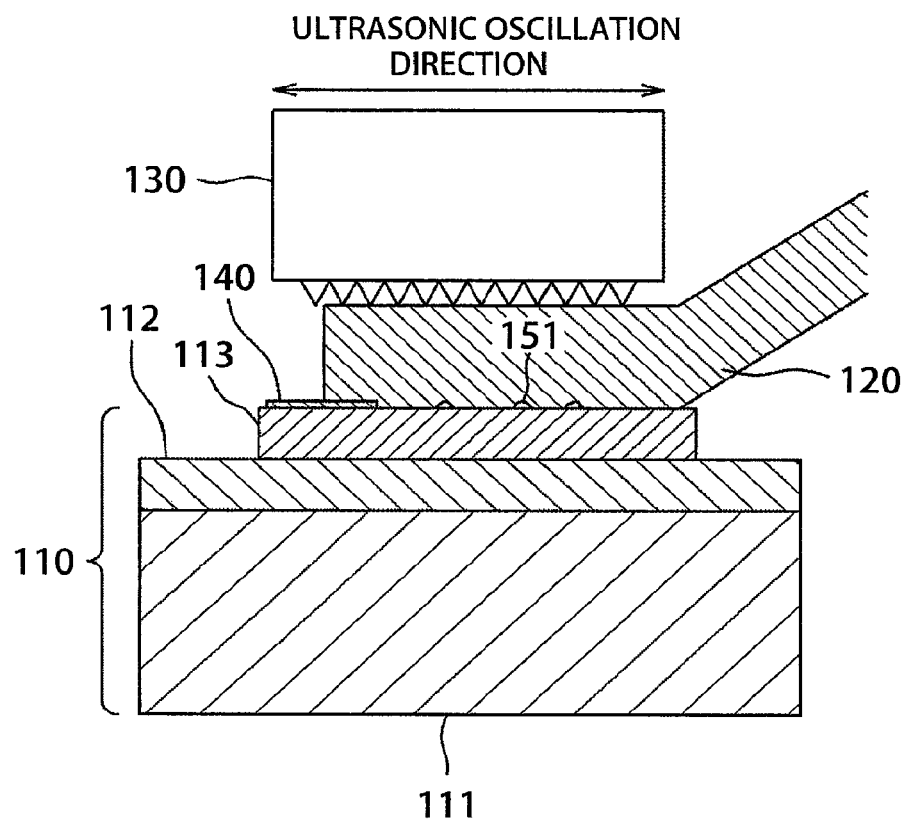
FIG. 1 is a sectional view illustrating an ultrasonic bonding process according to the present invention.
Figure 2:
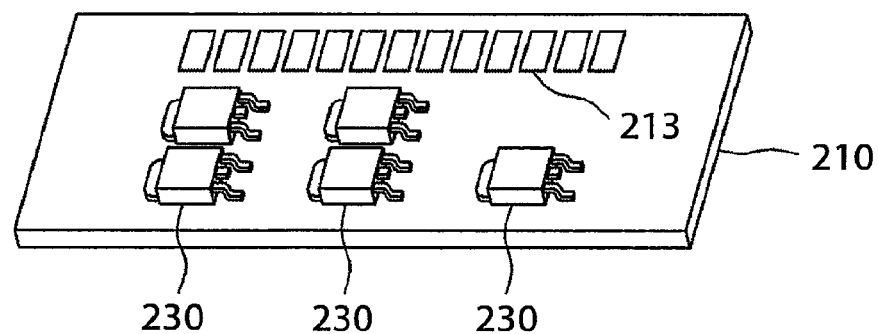
FIG. 2 is a perspective view illustrating a power module substrate.
Figure 3A:
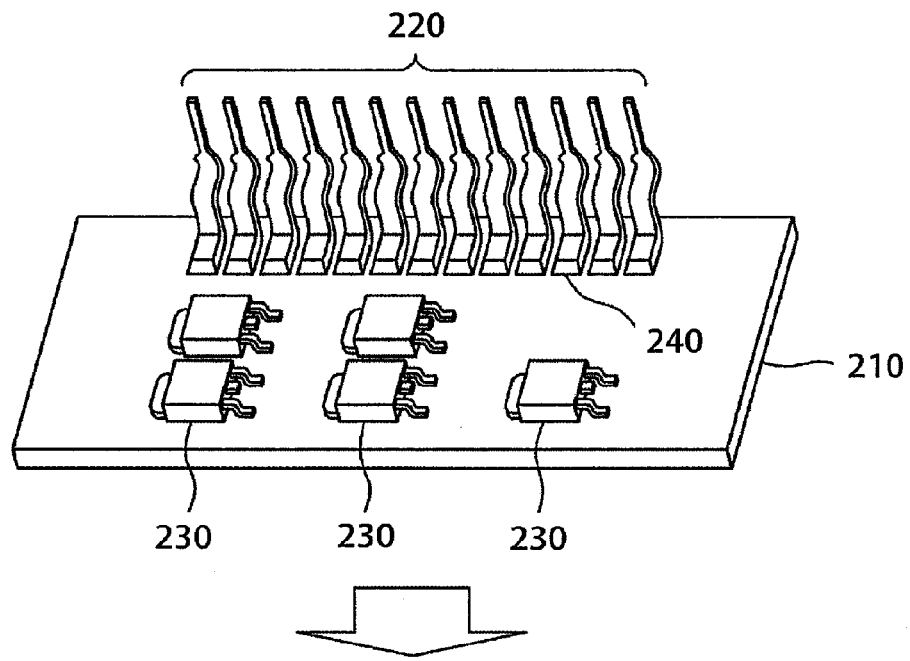
FIGS. 3A and 3B are perspective views each illustrating the state where the power module substrates are laminated.
Figure 3B:
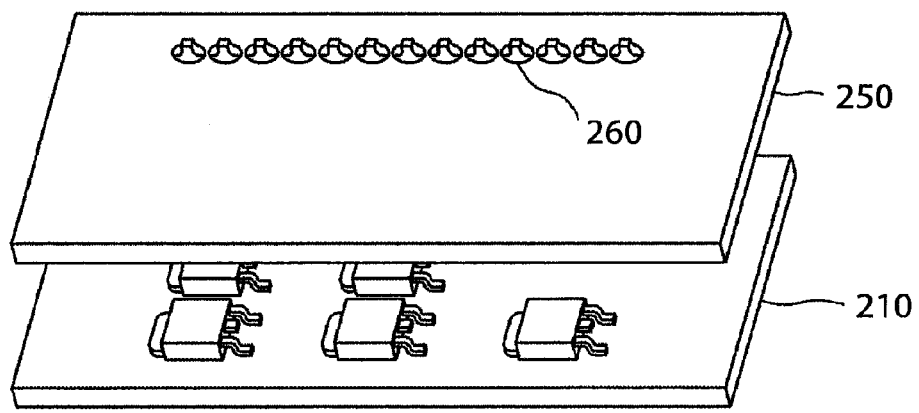
Figure 4A:
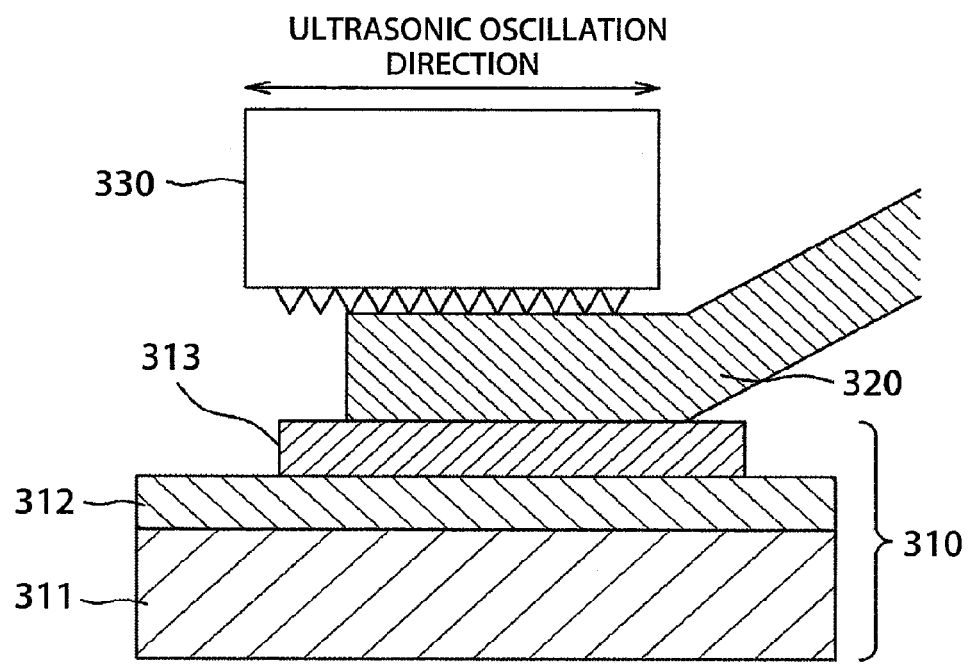
FIGS. 4A and 4B are sectional and plan views of a related art structure.
Figure 4B:
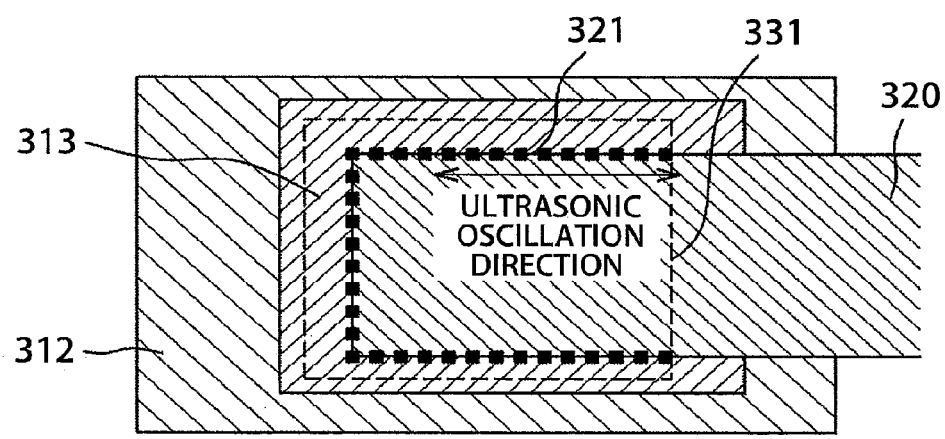

Embodiments of the present invention will be described referring to the drawings. FIG. 1 is a sectional view of a structure according to the embodiment. The structure is formed of a substrate 110 which includes a radiator plate 111, an insulating layer 112 on the radiator plate 111 and a pad 113 on the insulating layer 112, and a terminal 120 ultrasonic bonded to the pad 113. A thin metal layer 140 formed of a soft metal or a highly slidable metal is located just below an edge of the terminal 120 so as to be interposed between the terminal 120 and the pad 113.

Referring to FIG. 1, the radiator plate 111 of the substrate 110 has a thickness of 2 mm, the insulating layer 112 has a thickness of 0.1 mm, the pad 113 of the substrate 110 has a thickness of 0.1 mm, and the terminal 120 has a thickness of 0.6 mm, for example. The buffer metal layer 140 has a thickness of approximately 5 μm, for example.

Figure 5:
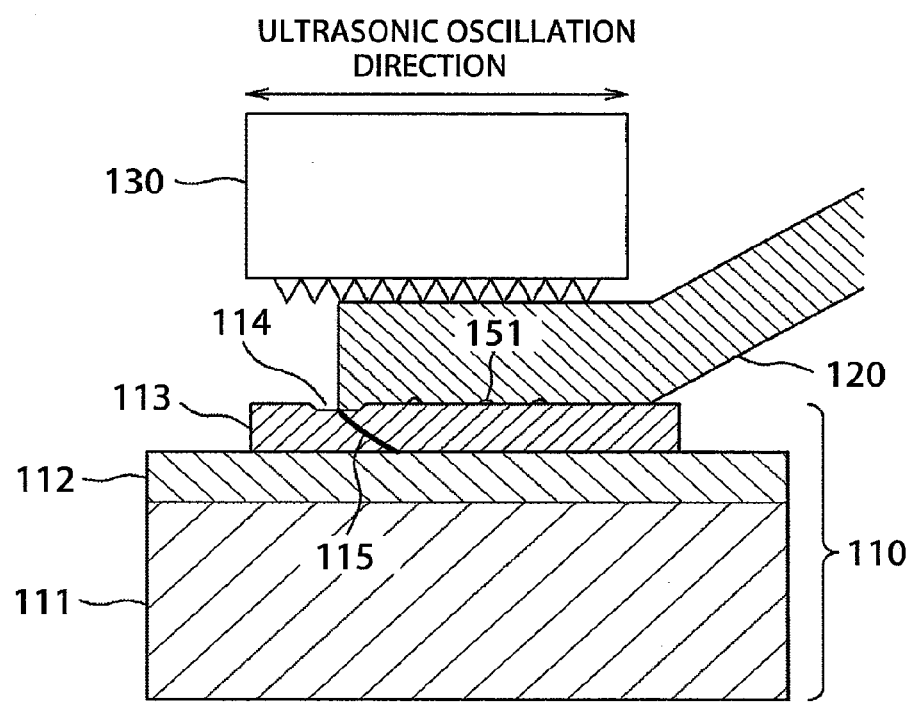
FIG. 5 is a sectional view illustrating a disadvantage of the related art structure.

FIG. 5 is a sectional view of a related art structure as a comparative example. The structure shown in FIG. 5 is formed of the substrate 110 which includes the radiator plate 111, the insulating layer 112 on the radiator plate 111, and the pad 113 on the insulating layer 112, and the terminal 120 directly ultrasonic bonded to the pad 113. The drawing shows abrasion 114 and a crack 115 in the pad 113 under the high frictional force and the shear force due to the friction just below the edge of the terminal 120. Since the shear force is proportional to the frictional force, and the frictional force is proportional to the pressure, abrasion and a crack occur just below the edge of the terminal at which the pressure becomes locally increased.

Figure 6:
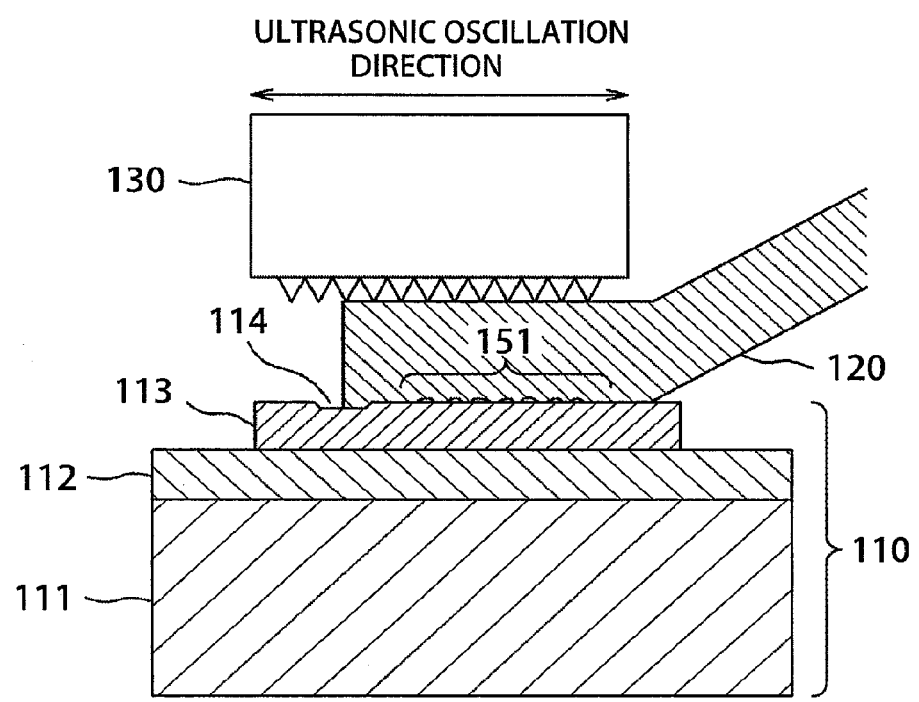
FIG. 6 is a sectional view illustrating another disadvantage of the related art structure.

FIG. 6 illustrates the structure which prevents a crack in the pad 113 by reducing the pressure caused by the ultrasonic bonding. Referring to FIG. 6, there are gaps 151 existing at the interface between the pad 113 and the terminal 120 over a wide range of the bonded surface. Each of those gaps 151 is an opening of a non-contact portion or a non-bonded portion upon the ultrasonic bonding.

The aforementioned phenomenon will be further described as below. Intrinsically, convex and concave portions exist on each surface of the pad and the terminal. The bonded surface may be smoothed under the ultrasonic pressurization to a certain extent. However, the surface cannot be formed to be completely flat, and accordingly, the convex and concave portions still exist from a microscopic aspect. The non-contact and the contact portions exist between the pad and the terminal upon the ultrasonic pressurization. Then there is a pressure distribution on the contact portion.

The contact portion may have a region of bonding at sufficiently high pressure and a region of no bonding under insufficient pressure. The non-bonded portion is opened simultaneously with disappearance of the pressurization to form the gap 151 together with the non-contact portion. The gap 151 does not contribute to the bonding strength and electric conduction. The structure illustrated in FIG. 6 shows a high rate of the gaps 151 to the bonded surface, resulting in low bonding strength, conductivity and radiation performance.

Figure 7A:
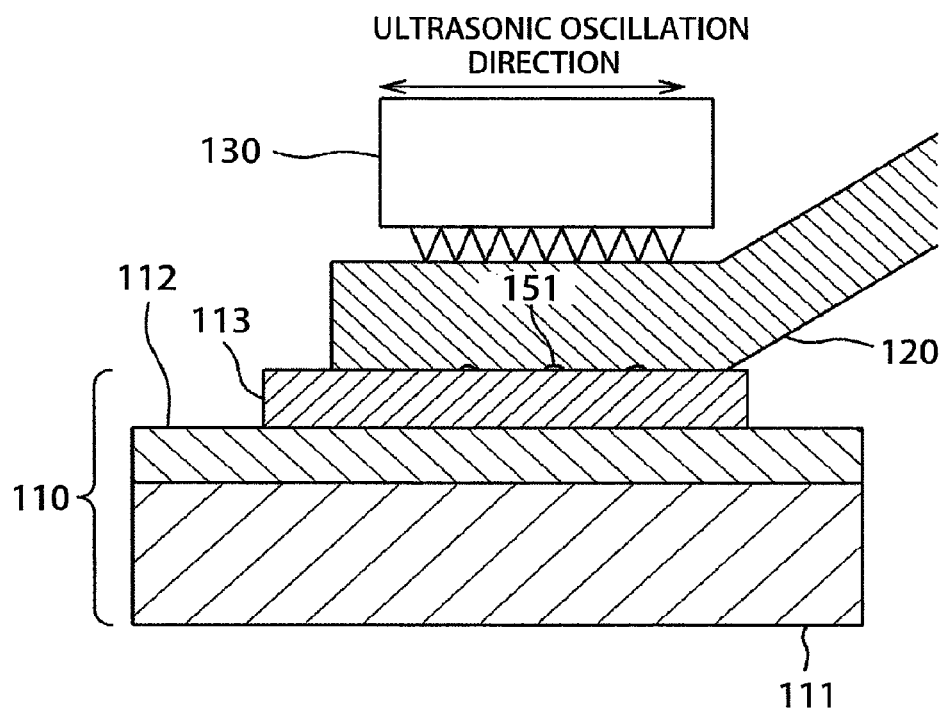
FIGS. 7A and 7B are sectional and plan views of another related art structure.
Figure 7B:
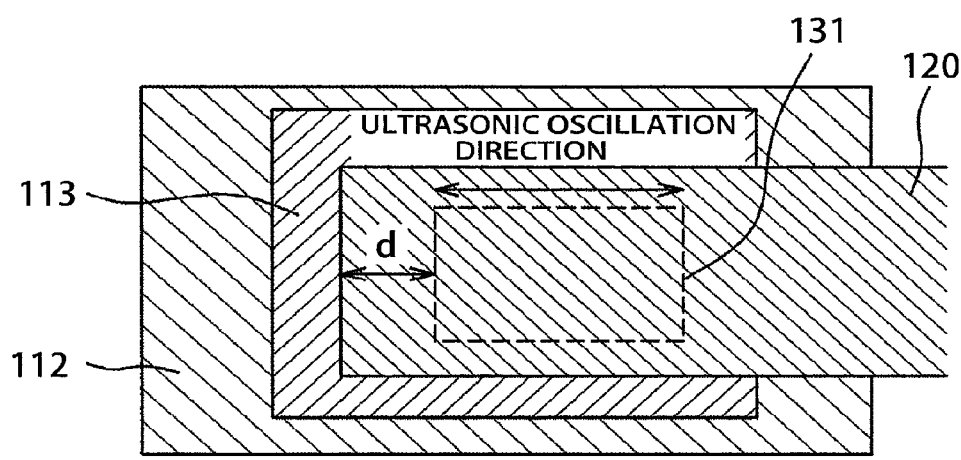

Meanwhile, FIGS. 7A and 7B illustrate the ultrasonic bonding performed in the region which covers no terminal edge. As a result, the pressure exerted to the portion of the pad just below the terminal edge is reduced to avoid abrasion and a crack in the pad. The structure shown in FIGS. 7A and 7B requires enlargement of the terminal (increasing thickness and length) or reduction of the bonded area. If the terminal is enlarged, the pitch reduction will be interfered, thus failing to downsize the module structure. If the bonded area is reduced, the conductivity and the radiation performance will be deteriorated.

It is difficult for the related art to satisfy all the requirements of high reliability, bonding strength, conductivity and radiation performance, while reducing the pitch for downsizing without causing a crack in the pad.

The use of the present invention as shown in FIG. 1 may realize the highly reliable compact terminal-substrate bonded structure while suppressing deterioration in the bonding strength, conductivity and the radiation performance. Referring to FIG. 1 as the sectional view of the present invention, the thin buffer metal layer 140 formed of the soft metal or the highly slidable metal is interposed between the edge of the terminal 120 and the pad 113.

Referring to FIG. 1, in the case where the soft metal is used for forming the buffer metal layer 140, it will be deformed and cut in the initial stage of the ultrasonic bonding. This may reduce the frictional force exerted to the pad to prevent abrasion and a crack therein. In the case where the highly slidable metal is used for forming the buffer metal layer 140, the frictional force is reduced by the antifriction action to prevent abrasion and a crack in the pad.

Meanwhile, the terminal is directly ultrasonic bonded to the pad in the region without the buffer metal layer 140. This makes it possible to provide the highly reliable terminal-substrate bonded structure with sufficient bonding strength without causing a crack in the pad. The respective bonded portions among the pad 113, the buffer metal layer 140, and the terminal 120 according to the present invention contribute to improved conductivity and radiation performance.

Deterioration in the conductivity and the radiation performance caused by the reduced area of the region where the terminal is directly bonded to the pad may be suppressed to a certain extent. The soft metal such as In or the soft and highly slidable metal such as Sn may be employed for forming the buffer metal layer 140.

Meanwhile, the resin layer may be employed in place of the buffer metal layer 140. In this case, the resin is cut by the ultrasonic oscillation, and scatters to be caught inside the bonded surface, which may cause the risk of disturbing bonding between the pad and the terminal. Intrusion of the resin inside the bonded surface may prevent provision of sufficient conductivity and radiation performance. According to the present invention, even if the buffer metal layer 140 is cut and scattered to be caught inside the bonded surface, intrusion of such metal will cause little adverse affect on the conductivity and the radiation performance.

Referring to FIG. 1, the buffer metal layer 140 is disposed on the line of the pad corresponding to the end of the terminal 120 in a direction perpendicular to the ultrasonic oscillation direction. In the case where the cross section of the terminal 120 is quadrilateral, the pressure is intensively applied to the pad at the portion corresponding to the side ends of the terminal (that is, up and down sides in the vertical direction of the drawing) upon the ultrasonic bonding to cause a crack in the pad. It is, thus effective for disposing the buffer metal layer 140 below the side end portion of the terminal.

Figure 9A:
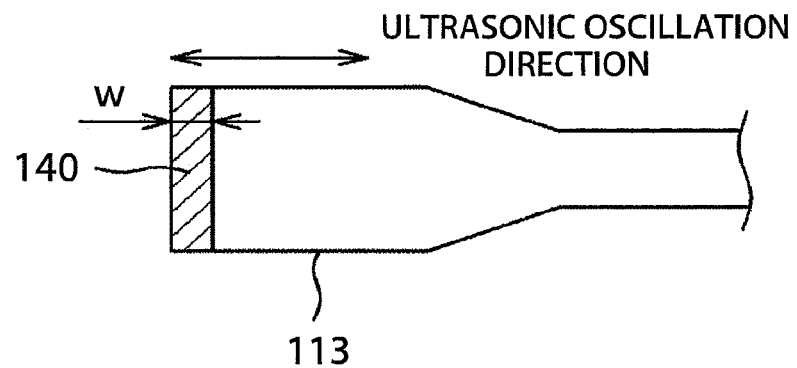
FIGS. 9A to 9C are plan views each illustrating a buffer metal layer.
Figure 9B:
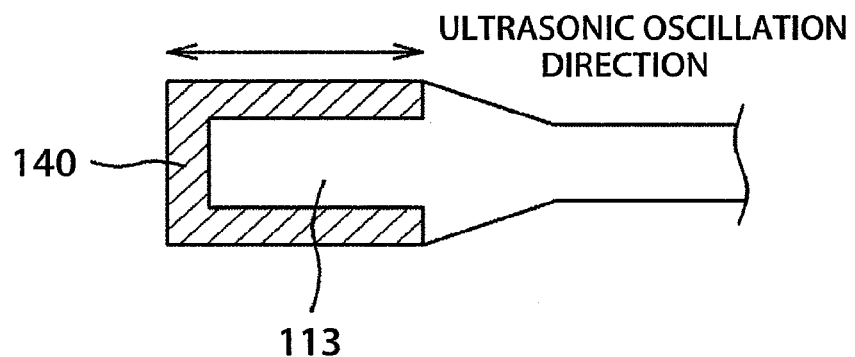
Figure 9C:
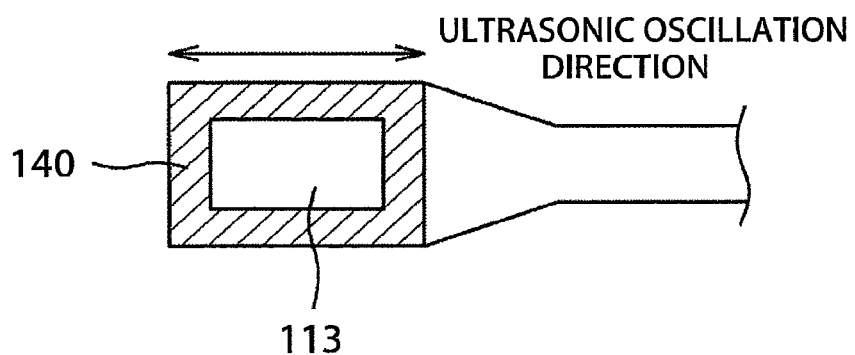

FIGS. 9A to 9C are plan views each illustrating an example of the buffer metal layer 140 formed on the substrate pad 113. FIG. 9A illustrates an example where the buffer metal layer is formed corresponding to the sectional view of FIG. 1. The buffer metal layer 140 shown in FIG. 9A is formed along the tip end line of the substrate pad in the direction perpendicular to the ultrasonic oscillation direction.

Referring to FIG. 9B, in addition to the structure shown in FIG. 9A, the buffer metal layer 140 is formed along the side lines of the substrate pad 113. Referring to FIG. 9C, the buffer metal layer 140 is formed along an inner periphery of the substrate pad 113. It is essential to form the buffer metal layer 140 along the tip end line of the substrate pad perpendicular to the ultrasonic oscillation direction. Otherwise the formation of the buffer metal layer 140 may be determined in consideration of the bonding strength, and effects of the conductivity and the radiation performance.

A material such as Sn and In may be employed for forming the buffer metal layer 140 shown in FIGS. 9A to 9C. The layer has the thickness of approximately 5 μm, and the width w of approximately 1 mm, for example.

A specific example of the respective elements illustrated in FIG. 1 will be described. It is preferable to employ the material with high radiation performance such as Cu and Al for forming the radiator plate 111 of the substrate as illustrated in FIG. 1. The material of ceramics or the resin is generally employed for forming the insulating layer 112 of the substrate. It is preferable to mix a radiating filler with the resin so as to enhance the radiation performance.

It is preferable to employ the material with excellent electric conductivity and radiation performance such as Cu, Al, and Ag for forming the pad 113 of the substrate and the terminal 120. Preferably, the alloy which mainly contains the aforementioned element may be employed for improving the mechanical property.

Figure 8:
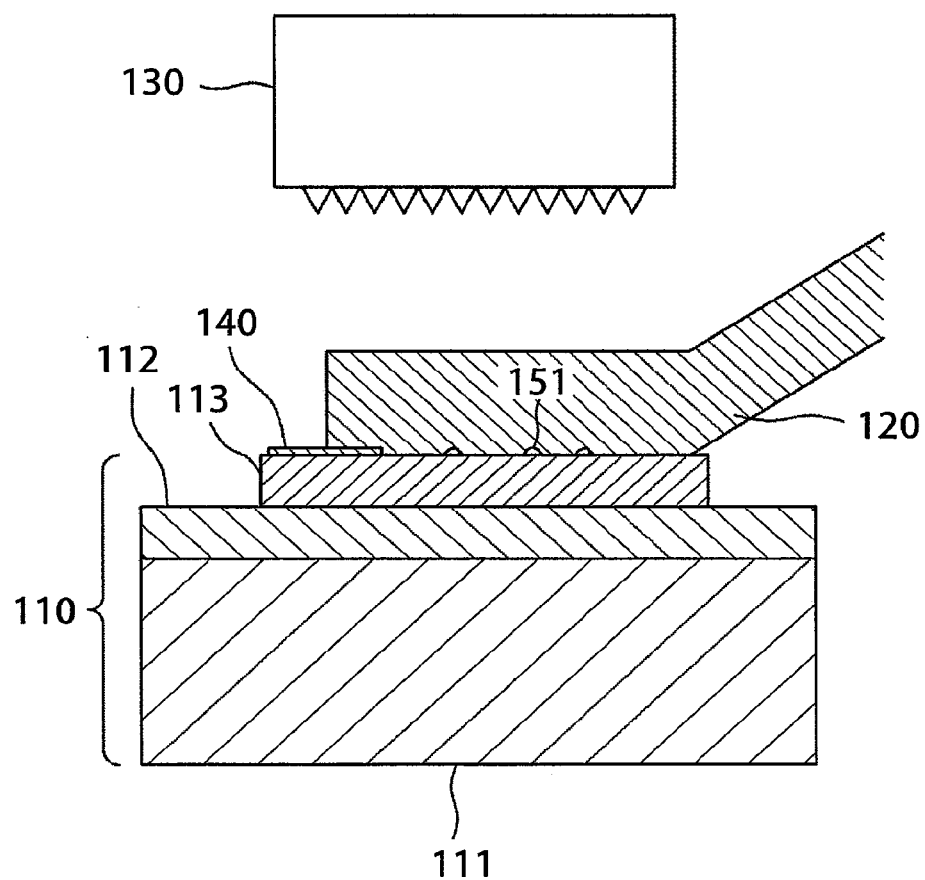
FIG. 8 is a sectional view illustrating a bonding process according to a first embodiment of the present invention.

The manufacturing method for realizing the aforementioned structure will be described. FIG. 8 illustrates the ultrasonic bonding for realizing the aforementioned structure. The substrate 110 is prepared by forming the insulating layer 112 on the radiator plate 111, and further forming the pad 113 on the insulating layer 112. Then the buffer metal layer 140 is partially formed on the pad 113 through partial plating.

The terminal 120 is mounted on the pad 113 and the buffer metal layer 140, and the ultrasonic bonding tool 130 is set on the terminal 120 to apply ultrasonic wave therethrough while pressurizing. The pad 113 is then bonded to the terminal 120 to form the bonded structure. The terminal 120 is located to have its end portion disposed on the buffer metal layer 140 so as to alleviate the pressure exerted to the pad 113 at the portion corresponding to the end portion of the terminal, and to prevent a crack in the pad 113. The contribution of the region with the buffer metal layer 140 to the conductivity and the radiation performance of the bonded portion between the pad 113 and the terminal 120 is sufficiently high while the bonding strength is relatively low. The terminal 120 except the end portion is directly bonded to the pad 113 to provide sufficient bonding strength, conductivity and radiation performance.

Methods of producing the buffer metal layer 140 will be described hereinafter. In a first method, the buffer metal layer is formed on the region which covers the edge of the terminal through the partial plating. In a second method, a metal foil is disposed over the region of the substrate pad just below the edge of the terminal. The terminal is mounted on the aforementioned region, and ultrasonic bonded from above using the bonding tool.

Figure 11:
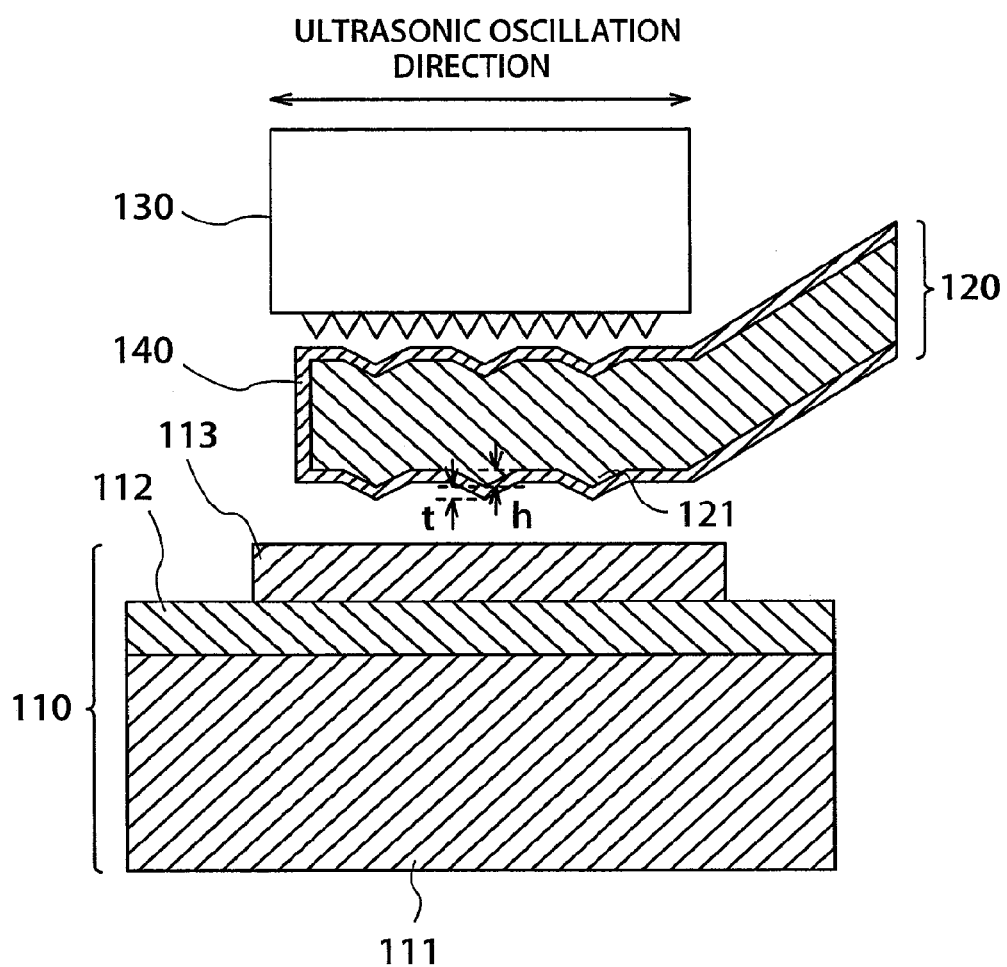
FIG. 11 is a sectional view illustrating a bonding process according to a third embodiment of the present invention.
Figure 13:
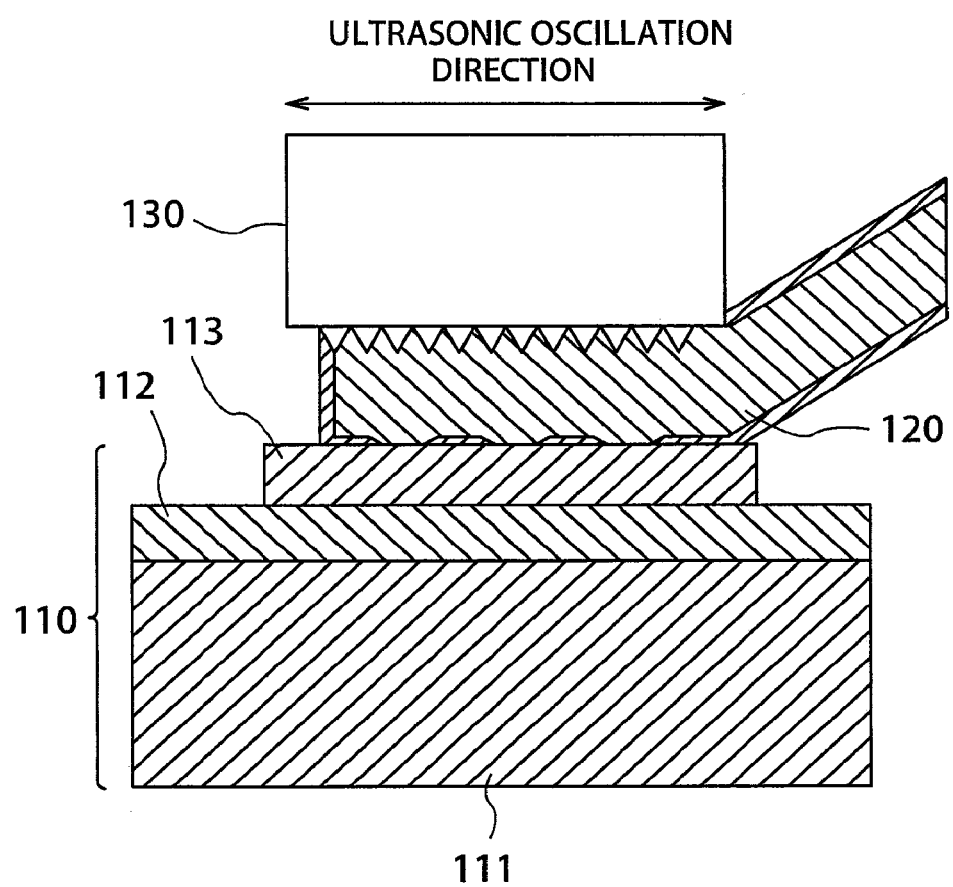
FIG. 13 is a sectional view illustrating a third embodiment of the present invention.

FIG. 11 illustrates another ultrasonic bonded structure for realizing the abovementioned structure. The protrusion 121 is formed on the bonding surface of the terminal, and the buffer metal layer 140 is provided over an entire surface of the terminal including the bonding surface. In this way, the buffer metal layer 140 is pushed outside the protrusion 121 upon the ultrasonic bonding such that the protrusion 121 of the terminal is directly bonded to the pad through the buffer metal layer 140 as shown in FIG. 13.

In the ultrasonic pressurization, the pressure at the tip of the protrusion 121 of the terminal is maximized, and then the pressure decreases as the position moves apart from the tip. The buffer metal layer 140 is pushed outward from the tip of the protrusion under the ultrasonic oscillation.

Figure 12:
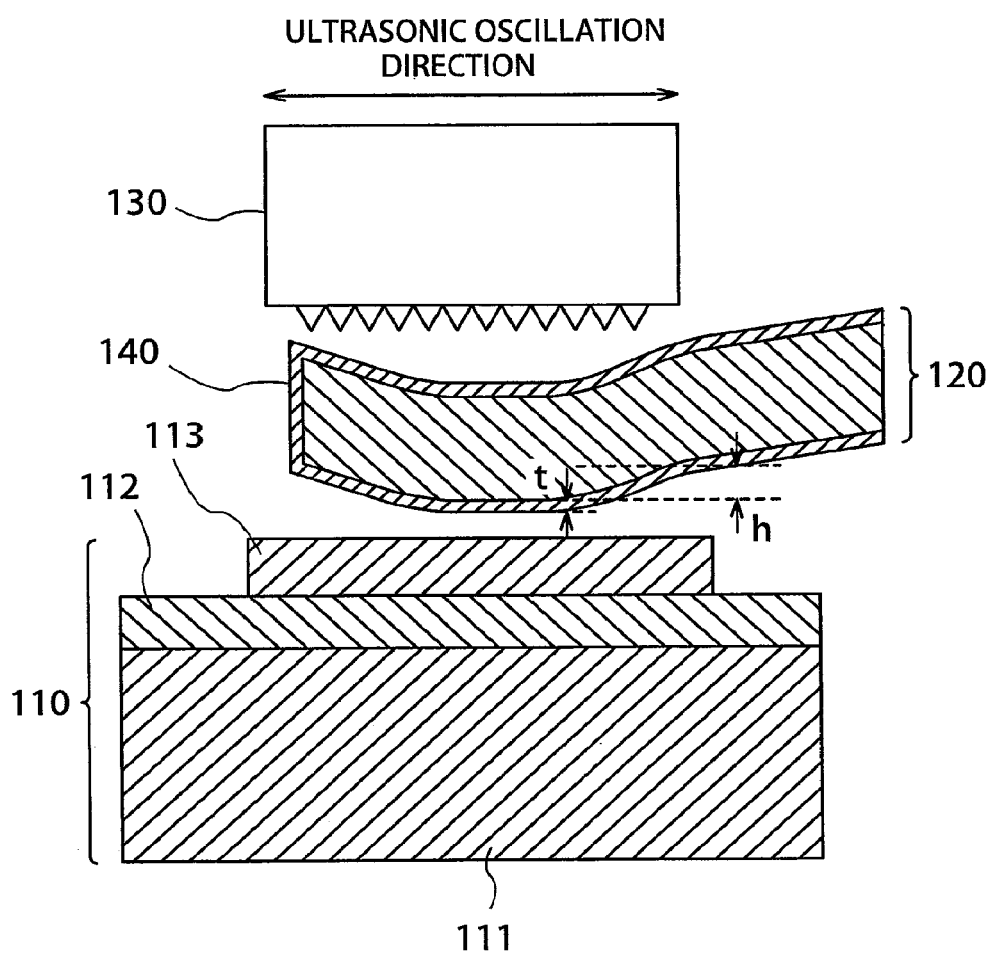
FIG. 12 is a sectional view illustrating a bonding process according to a fourth embodiment of the present invention.

The buffer metal has the thickness gradually reduced as it gets closer to the tip of the protrusion 121 so as to be brought into contact with the pad for ultrasonic bonding. A height h of the protrusion has to be larger than a thickness t of the buffer metal layer. The similar effect may be obtained by forming the bonding surface of the terminal to the convex curve as shown in FIG. 12. In such a case, convexity h of the convex curve has to be larger than the thickness t of the buffer metal layer.

The aforementioned structure eliminates the need of costly partial plating, and allows the full plating at lower cost to realize the aforementioned structure. The protrusion and the convex curve may be formed through a less costly punching process.

Referring to FIGS. 11 and 12, the buffer metal layer 140 is formed on the surface of the terminal 120. However, a similar effect is also provided evidently when the buffer metal layer 140 is formed on the upper surface of the substrate pad 113. In such a case, the buffer metal is plated on the substrate pad, or the foiled buffer metal is disposed on the substrate pad.

Figure 15A:
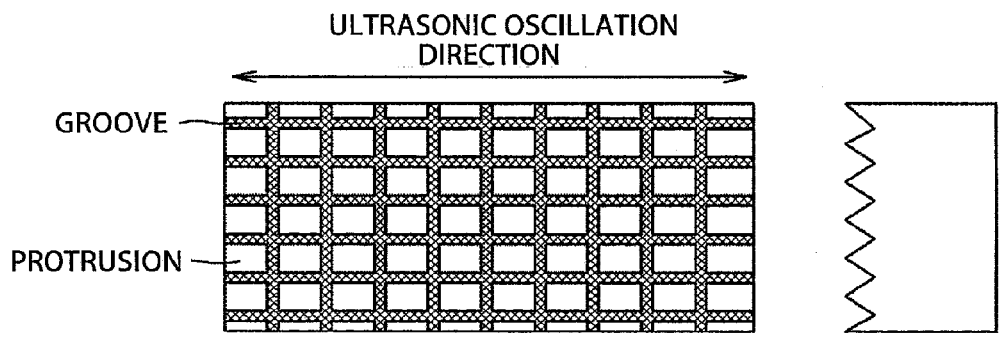
FIGS. 15A to 15C are sectional views each illustrating another example of the third or the fourth embodiment of the present invention.
Figure 15B:
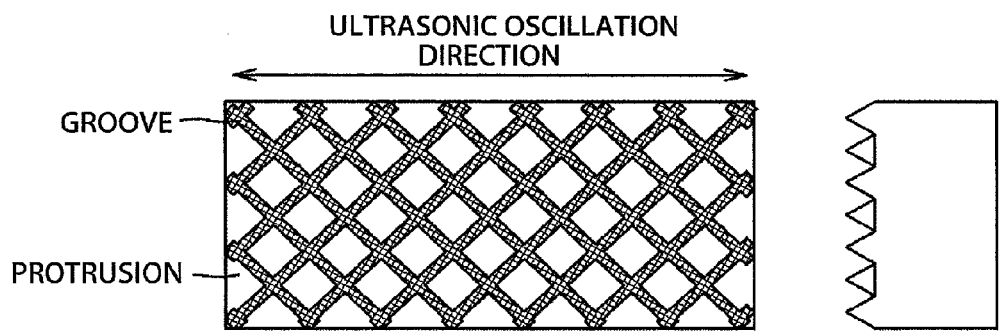

Referring to FIG. 12, the convex curve is formed to have a convex shape in the ultrasonic oscillation direction. However, it may be formed in the direction perpendicular to the ultrasonic oscillation direction. Referring to FIGS. 15A and 15B, it is effective to form protrusions in matrix on the back surface of the terminal.

Figure 15C:
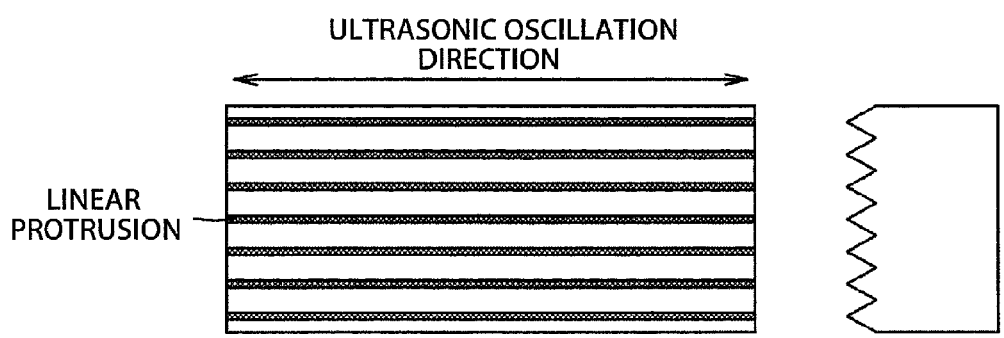

The angle of the groove may be in the range between those shown in FIGS. 15A and 15B. It is effective to form linear protrusions as shown in FIG. 15C on the back surface of the terminal. Preferably, the linear protrusions are provided in parallel with the ultrasonic oscillation direction. It is effective up to the tilting angle of 30°.

First Embodiment

Experiments were performed to verify the effect of the present invention. The experimental result shows that the present invention provides good bonding with the peel strength of 25 N/mm or higher without causing a crack in the pad. The procedure of the experiment will be described hereinafter. The substrate 110 was prepared by forming the insulating layer 112 (epoxy resin which contains aluminum filler with thickness of 120 µm) on the radiator plate 111 (Al, thickness of 2 mm), and further forming the pad 113 (Cu, thickness of 105 µm) on the insulating layer 112. Then the terminal 120, and Cu rod with the width of 0.6 mm, thickness of 0.6 mm, and length of 10 mm were prepared. The buffer metal layer 140 (Sn, thickness of 5 µm) was formed on the portion of the Cu rod around the end portion only.

Thereafter, the terminal 120 was mounted on the pad 113, and the ultrasonic bonding tool 130 was set on the terminal 120 as shown in FIG. 1. The ultrasonic wave was applied via the terminal 120 by the ultrasonic bonding tool 130 for bonding the pad 113 to the terminal 120 while pressurizing. The process was performed under the ultrasonic application condition at the frequency of 30 kHz, the load of 80 N/mm$^2$, and the oscillation period of 0.4 s. There was no crack generated in the bonded portion (the pad protection effect was confirmed).

Second Embodiment

Figure 10:
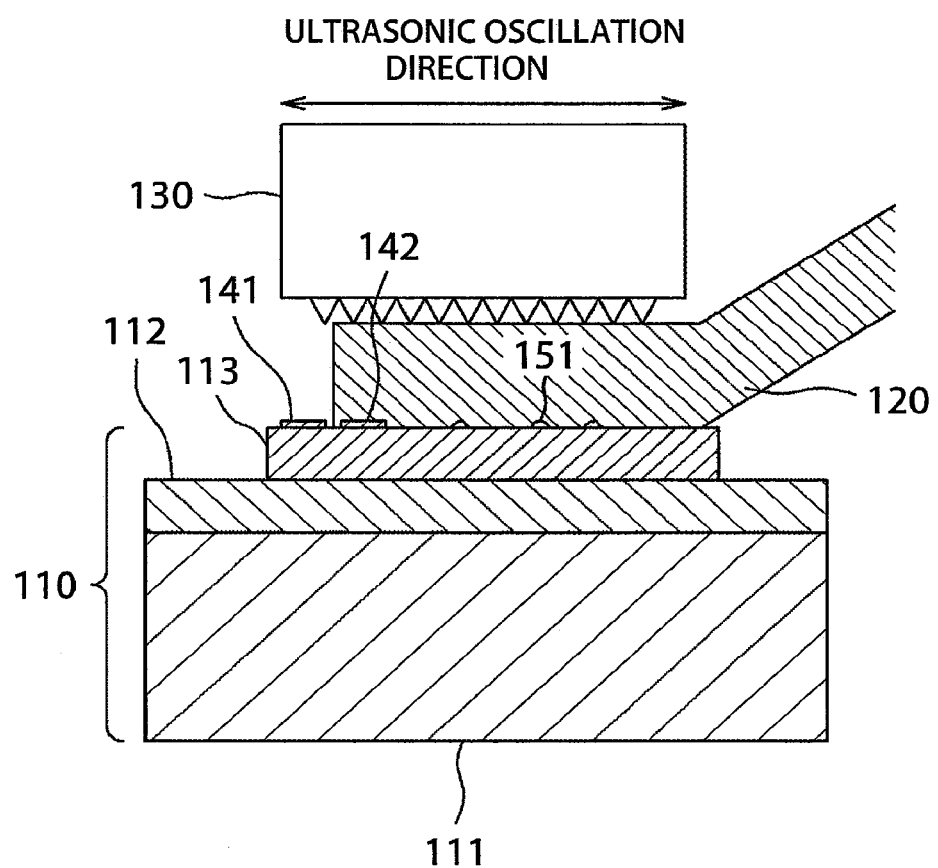
FIG. 10 is a sectional view illustrating a second embodiment of the present invention.

Another embodiment of the present invention will be described referring to FIG. 10. The embodiment is substantially the same as the first embodiment except the configuration of the buffer metal layer.

In the embodiment, the soft buffer metal layer is separated into members 141 and 142 upon the ultrasonic bonding. In other words, the buffer metal layer 140 as a single consecutive film in an initial state is separated at the end of the terminal by the ultrasonic energy upon the ultrasonic bonding.

In this case, the buffer metal layer does not exist just below the end of the terminal. However, the ultrasonic energy is used for separating the buffer metal layer to alleviate the pressure exerted to the pad 113 just below the end of the terminal 120. No crack was observed in the pad (the pad protection effect was confirmed).

Third Embodiment

A third embodiment of the present invention will be described referring to FIG. 13. The terminal with the protrusion on the ultrasonic bonding surface is ultrasonic bonded to the substrate pad around the tip of the protrusion. Assuming that the height h of the protrusion is set to 0.2 mm, and the plate thickness t is set to 5 µm, no crack was observed in the bonded portion (the pad protection effect was confirmed).

Fourth Embodiment

Figure 14:
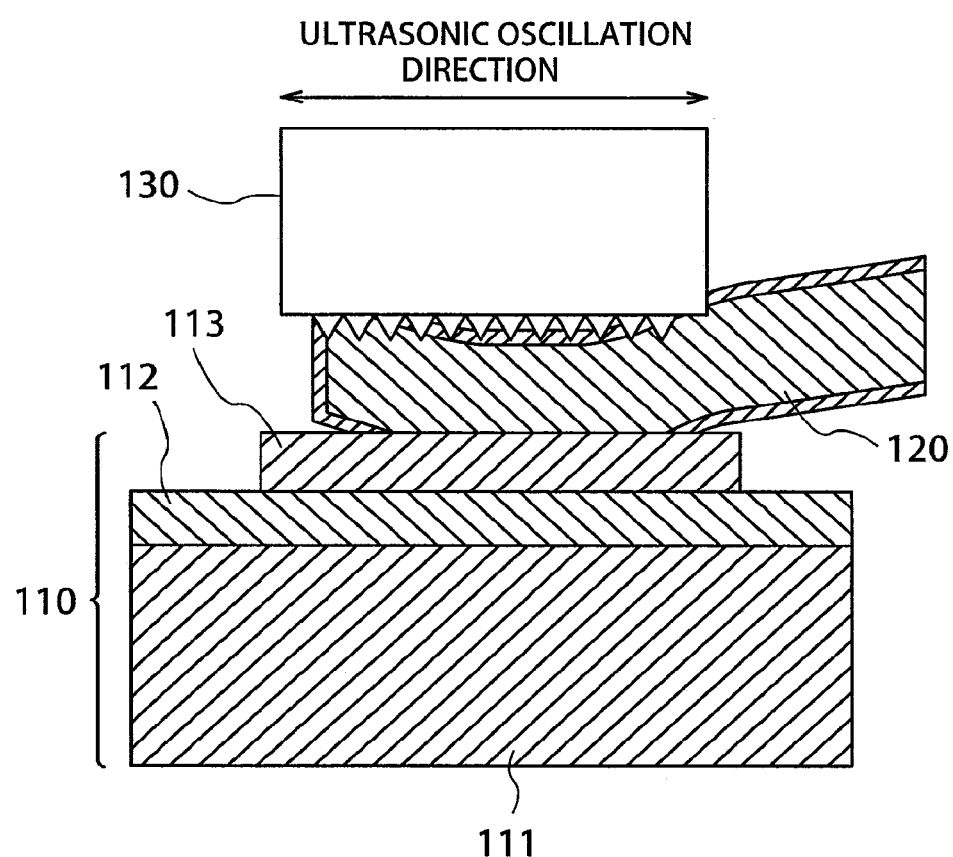
FIG. 14 is a sectional view illustrating a fourth embodiment of the present invention.

A fourth embodiment of the present invention will be described referring to FIG. 14. The terminal with the protrusion on the ultrasonic bonding surface is ultrasonic bonded to the substrate pad around the tip of the protrusion. Assuming that the convexity h of the convex curve is set to 0.2 mm, and the plate thickness t is set to 5 µm, no crack was observed in the bonded portion (the pad protection effect was confirmed.).

What is claimed is:

1. A connection structure having a radiator plate, a first insulating layer, a metal pad, and a terminal sequentially laminated in this order,
    wherein a first region and a second region exist between the metal pad and the terminal;
    wherein a buffer metal layer, which is formed of one of tin or indium, is interposed between the metal pad and the terminal in the first region, and the metal pad and the terminal directly connect at the second region,
    wherein the first region includes a region just below an edge of the terminal, and
    wherein the metal pad and the terminal are connected by an ultrasonic bond.

2. A method of manufacturing a connection structure having a radiator plate, a first insulating layer, a metal pad, and a terminal sequentially laminated in this order, the method comprising the steps of:
    interposing a buffer metal layer, which is formed of one of tin or indium, between the metal pad and the terminal; and
    ultrasonic bonding the metal pad and the terminal;
    wherein the buffer metal layer is formed between the metal pad and the terminal at a first region, and the metal pad and the terminal directly connect at a second region.

3. The method of manufacturing a connection structure according to claim 2, wherein the buffer metal layer is provided just below an edge of the terminal at the first region.

4. The method of manufacturing a connection structure according to claim 2, wherein the terminal includes a protrusion formed opposite the buffer metal layer at the second region.

5. The method of manufacturing a connection structure according to claim 2, wherein the terminal includes a convex curve surface formed opposite the buffer metal layer at the second region.

* * * * *